(12) United States Patent
Baluswamy

(10) Patent No.: US 7,655,384 B2
(45) Date of Patent: Feb. 2, 2010

(54) METHODS FOR REDUCING SPHERICAL ABERRATION EFFECTS IN PHOTOLITHOGRAPHY

(75) Inventor: Pary Baluswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 11/516,423

(22) Filed: Sep. 5, 2006

(65) Prior Publication Data

US 2007/0002312 A1 Jan. 4, 2007

Related U.S. Application Data

(63) Continuation of application No. 10/651,351, filed on Aug. 28, 2003, now abandoned.

(51) Int. Cl.
*G01B 9/00* (2006.01)

(52) U.S. Cl. .................. 430/311; 356/124; 356/125

(58) Field of Classification Search ............ None
See application file for complete search history.

(56) References Cited

U.S. PATENT DOCUMENTS

| 5,432,587 | A | 7/1995 | Nozue |
| 5,636,000 | A | 6/1997 | Ushida et al. |
| 5,831,715 | A | 11/1998 | Takahashi |
| 5,935,738 | A | 8/1999 | Yasuzato et al. |
| 5,973,863 | A | 10/1999 | Hatasawa et al. |
| 6,310,684 | B1 | 10/2001 | Matsuura |
| 6,440,620 | B1 | 8/2002 | Katsap et al. |
| 2004/0165194 | A1* | 8/2004 | Hansen ............... 356/521 |

* cited by examiner

*Primary Examiner*—Daborah Chacko Davis
(74) *Attorney, Agent, or Firm*—TraskBritt

(57) ABSTRACT

Methods to at least partially compensate for photoresist-induced spherical aberration that occurs during mask imaging used for photolithographic processing of semiconductor devices, LCD elements, thin-film magnetic heads, reticles and other substrates including photo-defined structures thereon are disclosed. A photoresist or other photosensitive material may be irradiated with a mask pattern image including a selected nonzero spherical aberration value to compensate for photoresist-induced spherical aberration.

7 Claims, 6 Drawing Sheets

US 7,655,384 B2

METHODS FOR REDUCING SPHERICAL ABERRATION EFFECTS IN PHOTOLITHOGRAPHY

CROSS-REFERENCE TO RELATED APPLICATION

This application is a continuation of application Ser. No. 10/651,351, filed Aug. 28, 2003, abandoned.

BACKGROUND OF THE INVENTION

1. Field of the Invention

The present invention relates to the processing of substrates, such as semiconductor wafers, using photolithography. More specifically, the present invention relates to methods for correcting photoresist-induced spherical aberration that occurs during photolithography.

2. State of the Art

Semiconductor devices including integrated circuitry, such as memory dice, are mass produced by fabricating hundreds or even thousands of circuit patterns on a single semiconductor wafer or other bulk semiconductor substrate using photolithography in combination with various other processes. In order to increase the number of memory cells on semiconductor memory devices for a given surface area, it is important to accurately control the optical resolution of the images produced during photolithography. These images are used to define structural features on a semiconductor substrate to fabricate the integrated circuitry of such semiconductor memory devices.

Photolithography is a process in which a pattern is delineated in a layer of material, such as a photoresist, sensitive to photons, electrons, or ions. In photolithography, an object containing a pattern (e.g., reticle or mask) is exposed to incident light. The image from the reticle or mask is projected onto a photoresist that covers a wafer or other substrate. The photolithographic process typically involves exposing and developing the photoresist multiple times. At a given step, the photoresist is selectively exposed to photons, electrons, or ions, then developed to remove one of either the exposed or unexposed portions of photoresist, depending on whether a positive or negative photoresist is employed. Complex patterns typically require multiple exposure and development steps.

There are three predominant conventional photolithography methods of optically transferring a pattern on a mask to a photoresist that is coated on a substrate. These methods are contact printing, proximity printing, and projection printing. Currently, projection printing is the most frequently used type of exposing system. Referring to FIG. 1, a conventional exposing system used in projection printing is shown. Exposing system 100 includes illumination controller 101 coupled to illumination source 102 for producing light. Illumination source 102 typically includes a mirror, a lamp, a light filter, and/or a condenser lens system. In the exposing system shown in FIG. 1, illumination source 102 irradiates mask 108 having the desired pattern to be projected onto photoresist 110. Projection lens 104, which may include a complex set of lenses and/or mirrors, focuses the image from mask 108 onto photoresist 110. Photoresist 110 is developed and substrate 112 is subsequently processed as by etching to form the desired structures and photoresist 110 is then removed.

When projecting a mask pattern onto a photoresist using the above-described process, it is typically necessary to compensate for spherical aberration induced by the exposing system. Spherical aberration is caused by using spherically shaped lenses and mirrors because truly spherical surfaces do not form sharp images. An example of a spherical aberration is shown in FIG. 2. Paraxial light rays 202 and peripheral light rays 204 are incident on a lens 206. Paraxial light rays 202 and peripheral light rays 204 do not unite accurately at a focus. Rather than the light being focused at a point, it is focused along a line transverse to the plane of the target photoresist, resulting in a blurred image. The spherical aberration is defined as the distance between focal point 210 of paraxial light rays 202 and focal point 208 of peripheral light rays 204. By using a complex system of lenses and/or mirrors, the spherical aberration of an optical system used in conventional photolithography may be, and typically is, adjusted to zero. In other words, the light incident on photoresist 110 in FIG. 1 has a spherical aberration of zero.

Systems for controlling spherical aberration of the light incident on a photoresist are disclosed in U.S. Pat. No. 5,432,587 to Nozue and U.S. Pat. No. 5,973,863 to Hatasawa et al. U.S. Pat. No. 5,636,000 to Ushida et al. discloses a projection lens system that controls environmental effects on the resulting projected image. U.S. Pat. No. 5,935,738 to Yasuzato et al. and U.S. Pat. No. 6,310,684 to Matsuura disclose methods to measure spherical aberration in projection lens systems.

While these prior art methods and apparatus have provided the capability to compensate for spherical aberration within photolithography exposing systems, they do not completely overcome the problem. This is due to the fact that the point for focusing a mask pattern is not selected to be at the surface of a photoresist layer, but is at some point within the photoresist layer near the middle of its cross-sectional thickness. By focusing the mask pattern in this fashion, a more uniform exposure over the entire cross-section of the photoresist is achieved. This, in turn, provides mask features with well-defined profiles. FIG. 3 shows a graph of mask feature profiles that result from focusing at different focal points within the photoresist. On the left, FIG. 3 shows that when the focus depth is too shallow, such as by focusing the light at or near the surface of the photoresist, the upper portion of the photoresist is overexposed, resulting in a mask feature profile 114A that is rounded-off and not thick enough to provide sufficient protection for the subsequent etching process. At a median focus depth, mask feature profile 114B has uniform sidewalls and maintains the thickness of the photoresist. At lower focus depths, the bottom portion of the photoresist is overexposed, resulting in undercutting as shown by mask feature profile 114C.

Because the light must pass through a portion of the photoresist layer to reach the focus point, however, the refractive index of the photoresist itself may induce spherical aberration. Referring to FIG. 4A, the origin of photoresist-induced spherical aberration is shown, where the photolithography process is adjusted in the conventional manner to compensate for spherical aberration from the optical system. Incident light 302, having a spherical aberration set at zero, arrives at photoresist 110 at various angles due to diffraction of light off of mask 108 (not shown, see FIG. 1). Incident light 302 is refracted due to the difference in the index of refraction between air 306 and photoresist 110. However, since incident light arrives at various different angles, it is refracted by different amounts in accordance with Snell's law and comes into focus at different depths within the photoresist 110. Thus, refraction by photoresist 110 causes the focal points for light arriving at different incident angles to be separated along a line, resulting in spherical aberration 308. This separation of the incident light 302 within photoresist 110 is the photoresist-induced spherical aberration. FIGS. 4A and 4B also illustrate how incident light 302 at differing angles would ideally unite accurately at a single focal point 304 (shown by broken lines in FIG. 4A) in the absence of refraction by photoresist 110.

Because the density of integrated circuitry patterns is constantly increasing to meet semiconductor technology requirements, photoresist-induced spherical aberration is progressively becoming a significant problem. Photoresist-induced spherical aberration causes the best focus to be a function of mask pattern density and feature size and pitch (spacing). This is due to the diffraction of light at different angles by various mask patterns. Reduced pitch gives higher diffraction. Thus, features like isolated lines will produce different focal points within the photoresist layer than dense line patterns. For each type of feature, there is a process window wherein light may be focused above or below the feature focal point and be within a tolerable range for forming an acceptable feature profile as shown in FIG. 3. Because the focal points for each feature are at different locations, the process windows for the various features will also be different. Therefore, to provide mask feature profiles that are within a tolerable range for all mask features having different sizes and pitches, it is necessary to focus the mask pattern at a point within the photoresist layer where portions of the process windows for each feature overlap, which is the overall process window for the mask pattern.

Because the photoresist-induced spherical aberration causes the focal points for the different mask features to be farther apart, there will be less overlap of their corresponding process windows. Therefore, if spherical aberration is not corrected or compensated for, the acceptable overall process window will be smaller, reducing process tolerances. Failure to correct for spherical aberration can cause misregistration in the resulting resist pattern and, if focus is poor, the resulting resist pattern is not as "clean" or well defined, as shown on the right and left sides of FIG. 3.

Accordingly, in order to improve the quality of patterns transferred to photoresists using photolithography, a need exists to reduce photoresist-induced spherical aberration.

BRIEF SUMMARY OF THE INVENTION

The present invention, in a number of embodiments, includes methods to reduce, compensate for, or eliminate photoresist-induced spherical aberration exhibited in conventional photolithography processing. The present invention may be used in photolithography processing for fabrication of semiconductor devices, liquid crystal display elements, thin-film magnetic heads, reticles, and for many other applications that require accurate photolithographic imaging.

One exemplary embodiment comprises a method of adjusting the spherical aberration of light used to pattern a photoresist. A substrate having a photoresist disposed thereon is provided. An illumination source for producing light is provided in conjunction with a mask to project a mask pattern image on the photoresist. An optical element or system may then be used to set the spherical aberration of the mask pattern image to have a nonzero value selected to reduce, compensate for, or photoresist-induced spherical aberration effects. Photoresist-induced spherical aberration may be estimated from the resist refractive index and the nominal focus position in the resist. The mask pattern image having the selected spherical aberration is then used to irradiate the photoresist.

In another exemplary embodiment, the compensatory spherical aberration of the mask pattern image incident on the photoresist may be set approximately equal to the photoresist-induced spherical aberration of the photoresist when the photoresist is irradiated with light having a spherical aberration of zero.

In another exemplary embodiment, the compensatory spherical aberration of the mask pattern image incident on the photoresist may be determined according to a disclosed formula.

In another exemplary embodiment, the compensatory spherical aberration of the mask pattern image incident on the photoresist may be determined experimentally from process measurements.

In yet another exemplary embodiment, the mask pattern image having a predeterminded compensatory spherical aberration may be focused at approximately the middle of the cross-section of the photoresist.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 5A:
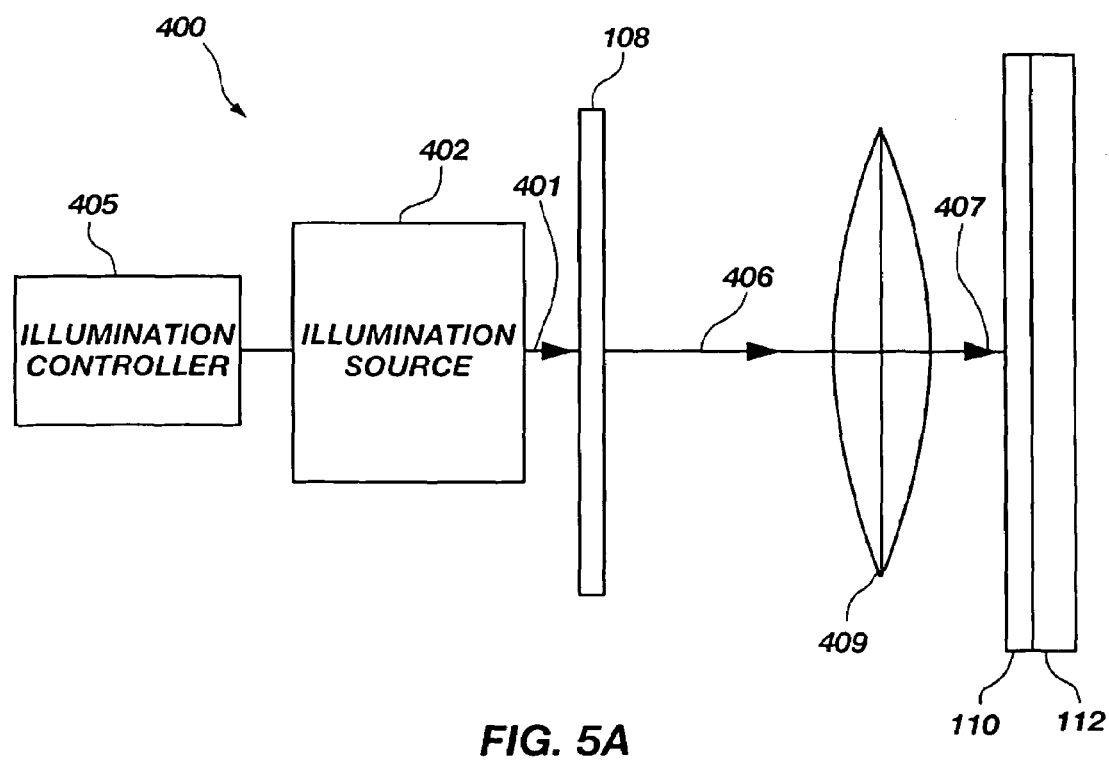
FIG. 5A is a schematic illustration of an exemplary embodiment of an exposing system used in the present invention.

The present invention includes methods to reduce, compensate for, or eliminate photoresist-induced spherical aberration exhibited in conventional photolithography processing. FIG. 5A illustrates the practice of the present invention in conjunction with the most common type of photolithography process used in semiconductor processing, projection printing. The present invention may employ step-and-repeat, step-and-scan type projection printing, or other similar systems.

Figure 5B:
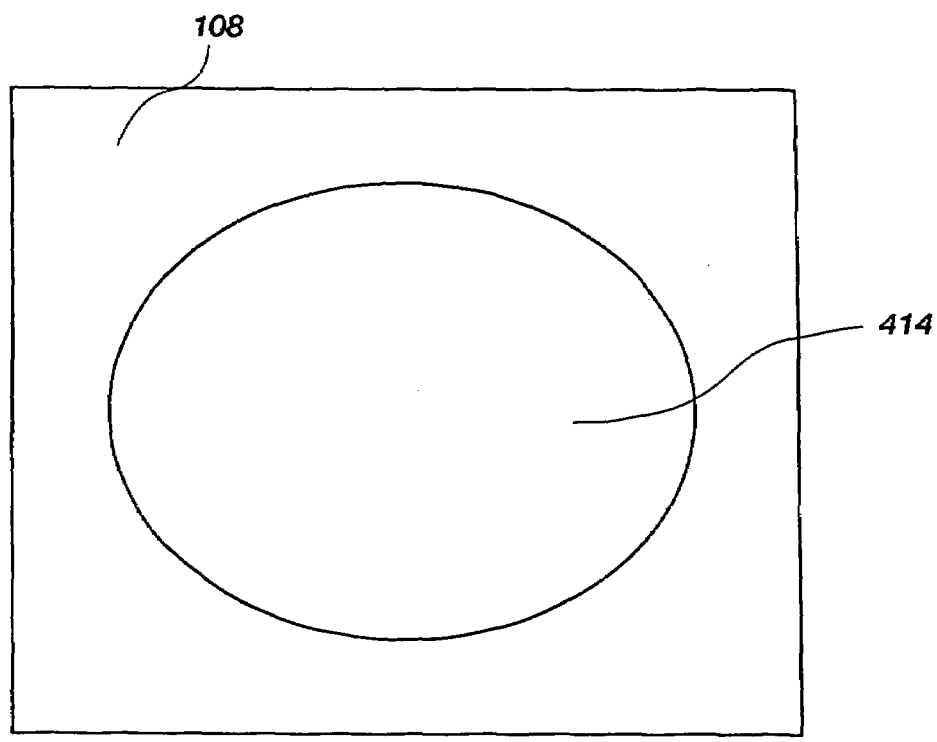
FIG. 5B is a schematic illustration of a pellicle secured to a mask suitable for use in the present invention.

Referring to FIG. 5A, an exemplary projection system 400 used in the method of the present invention is illustrated. Illumination controller 405 may be controllably coupled to illumination source 402 for projecting light rays 401. Illumination source 402 may include, for example, a mirror, a lamp, a light filter, and/or a condenser lens system. The term "light" as used herein is not restricted to visible light, but may also include other forms of radiation energy such as photons, laser beams, or x-rays. Mask 108, defining a pattern to be projected onto photoresist 110, receives light rays 401 from illumination source 402 to produce mask pattern image 406 representative of the pattern of mask 108. The terms "mask" and "reticle" are used synonymously throughout the following description of the present invention. Optionally, mask 108 may be secured to hard or soft pellicle 414 to protect mask 108 from contaminants, as shown in FIG. 5B. Hard pellicles include, for example, glass or polymer fibers.

Again with reference to FIG. 5A, projection lens apparatus 409 receives mask pattern image 406 from mask 108. Projection lens apparatus 409 may be, for example, a reduction lens or a combination of lenses and/or mirrors for focusing mask pattern image 406 onto the surface of photoresist 110. Typical semiconductor fabrication photolithography involves a four- to ten-times reduction of the pattern size on mask 108. Projection lens apparatus 409 projects mask pattern image 406 to produce a projected pattern image 407 comprising light rays 403 (not shown, see FIG. 6).

Projection lens apparatus 409 may be configured for altering the spherical aberration of mask pattern image 406 to reduce, compensate for, or eliminate the phenomenon of photoresist-induced spherical aberration caused by photoresist 110. Current optical systems used in photolithography are capable of varying the spherical aberration. Techniques for altering the spherical aberration in projection lens apparatus 409 are well known to those of ordinary skill in the art. For example, U.S. Pat. No. 5,973,863 to Hatasawa et al. ("Hatasawa"), the disclosure of which is incorporated herein by reference, teaches using a glass plate that is disposed at the bottom of the projection lens apparatus. As disclosed in Hatasawa, the spherical aberration of the projection lens may be controlled by altering the thickness and the radius of curvature of the glass plate.

The spherical aberration may also be altered external to projection lens apparatus 409. Systems for controlling spherical aberration external to projection lens apparatus 409 are disclosed in U.S. Pat. No. 5,432,587 to Nozue ("Nozue"), the disclosure of which is incorporated herein by reference. As disclosed in Nozue, a typical system for controlling spherical aberration of the light in projection lens systems includes varying the optical path between mask 108 and projection lens apparatus 409 or using a transparent parallel plate between mask 108 and projection lens apparatus 409. Other known methods for controlling spherical aberration include moving the position of the reticle and/or the photoresist with respect to the projection lens apparatus 409, as well as by slightly changing the wavelength of the projected light. However, unlike the present invention, which comprises altering the spherical aberration of projected pattern image 407 to a nonzero value to reduce, compensate for, or eliminate photoresist-induced spherical aberration, conventional optical systems used in photolithography typically set the spherical aberration to zero.

Projected pattern image 407, in accordance with the present invention, thus exhibits a predetermined spherical aberration set to reduce, compensate for, or eliminate the photoresist-induced spherical aberration from photoresist 110. Thus, the spherical aberration value of the projected pattern image 407 is opposite that of the photoresist-induced spherical aberration. Projected pattern image 407 may then be irradiated onto photoresist 110 on substrate 112. Substrate 112 may be a semiconductor substrate such as single crystal silicon, single crystal gallium arsenide, polysilicon, indium phosphide, a layered bulk semiconductor substrate (such as a silicon on insulator (SOI) substrate as exemplified by a silicon on glass (SOG) or silicon on sapphire (SOS) substrate), a glass (for example, soda-lime glass, borosilicate glass, or quartz) useful for forming reticles, or any other suitable material, such as those used in forming liquid crystal displays and thin film magnetic heads. Substrate 112 having photoresist 110 may be supported and held in position on a holding device such as a chuck (not shown), which may be part of, or controlled by, a stepper (not shown), as known in the art.

Referring to FIG. 5B, hard or soft pellicle 414 may be used to protect mask 108. Hard or soft pellicle 414 may also introduce a spherical aberration into mask pattern image 406 of FIG. 5A that must be corrected for by projection lens apparatus 409 or an apparatus external to it that is capable of setting the spherical aberration of the projected pattern image 407.

Figure 1:
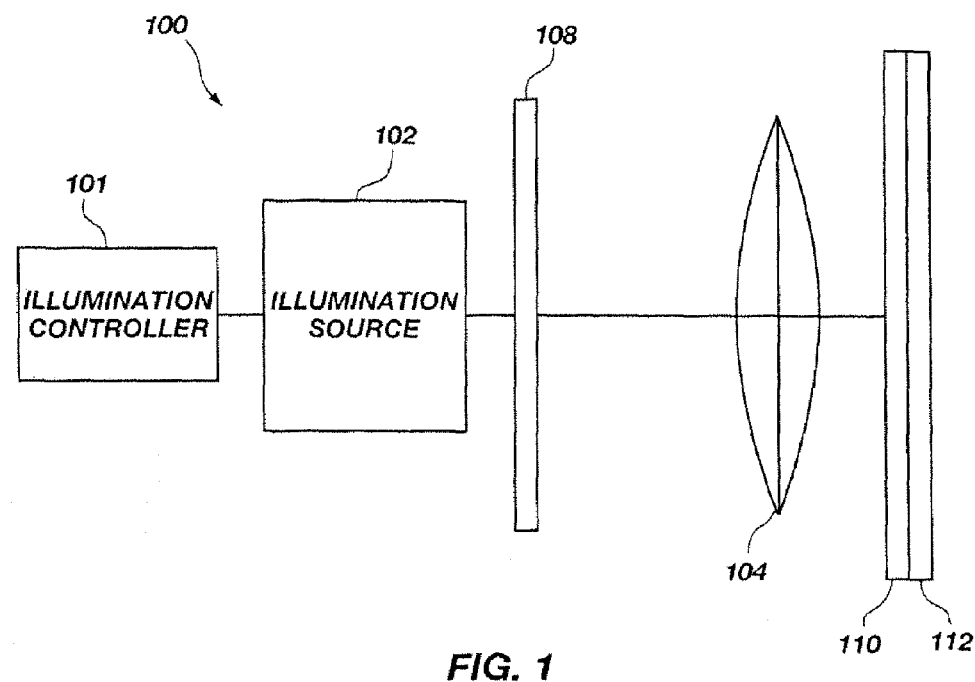
FIG. 1 illustrates a conventional projection printing-type photolithography system.
Figure 2:
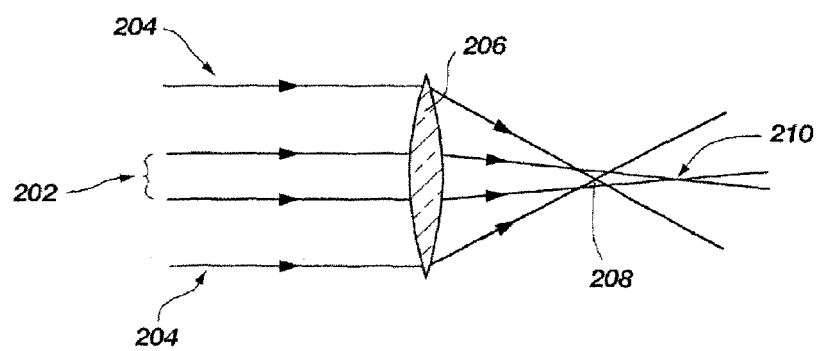
FIG. 2 schematically illustrates a spherical aberration phenomenon attributable to passage of light through a lens.
Figure 3:
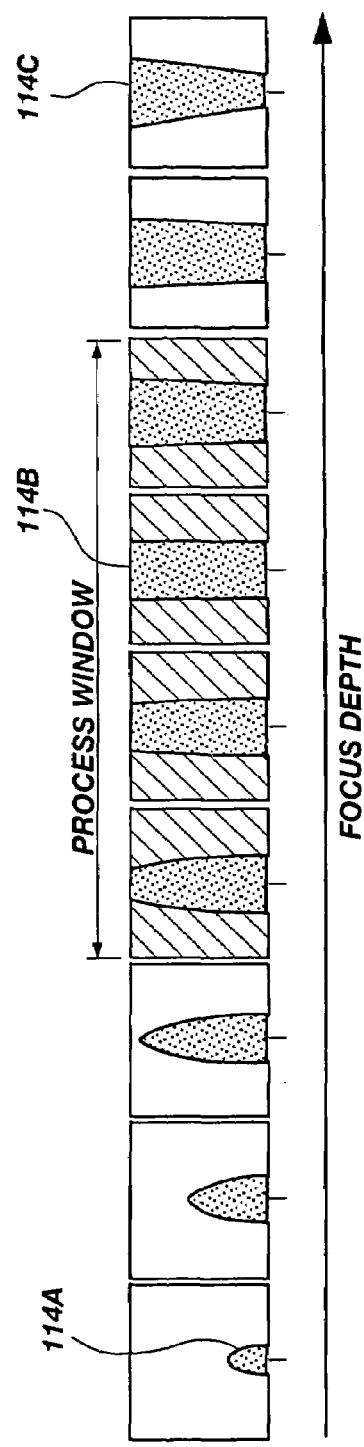
FIG. 3 illustrates mask feature profiles resulting from different focusing depths within a photoresist layer.
Figure 4A:
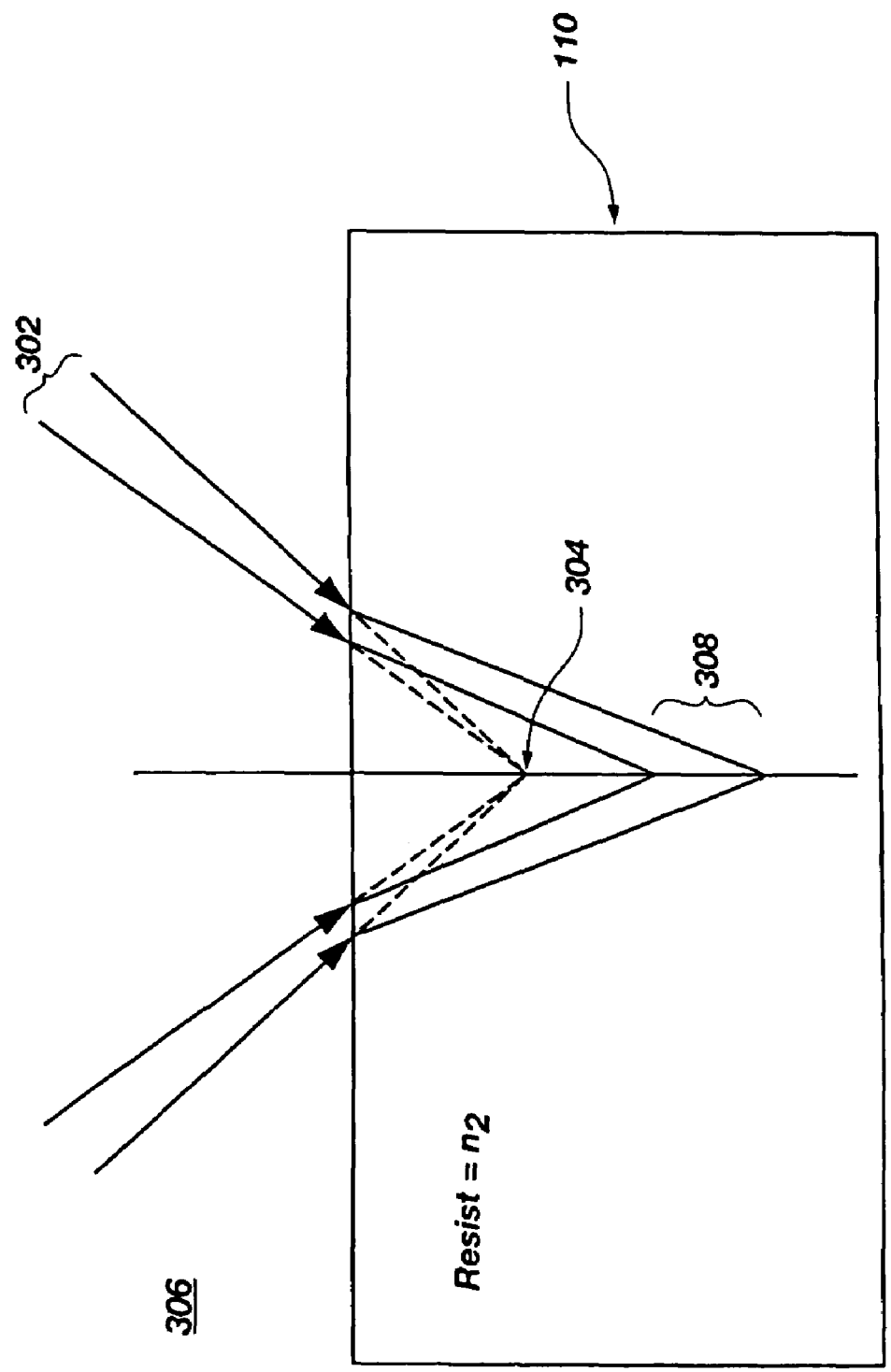
FIG. 4A schematically illustrates the phenomenon of photoresist-induced spherical aberration.
Figure 4B:
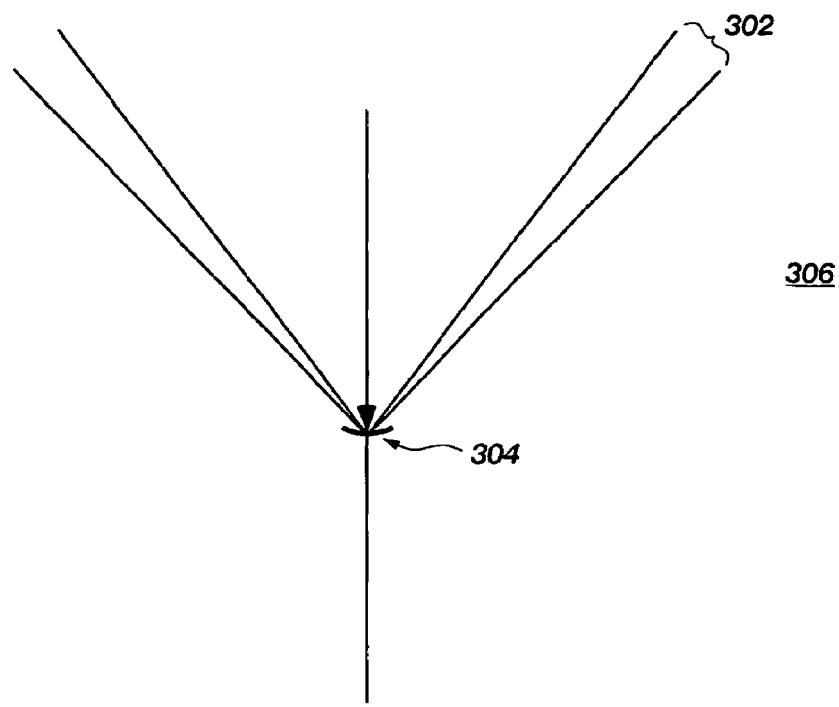
FIG. 4B schematically illustrates light rays focused to a point in the absence of a photoresist.
Figure 6:
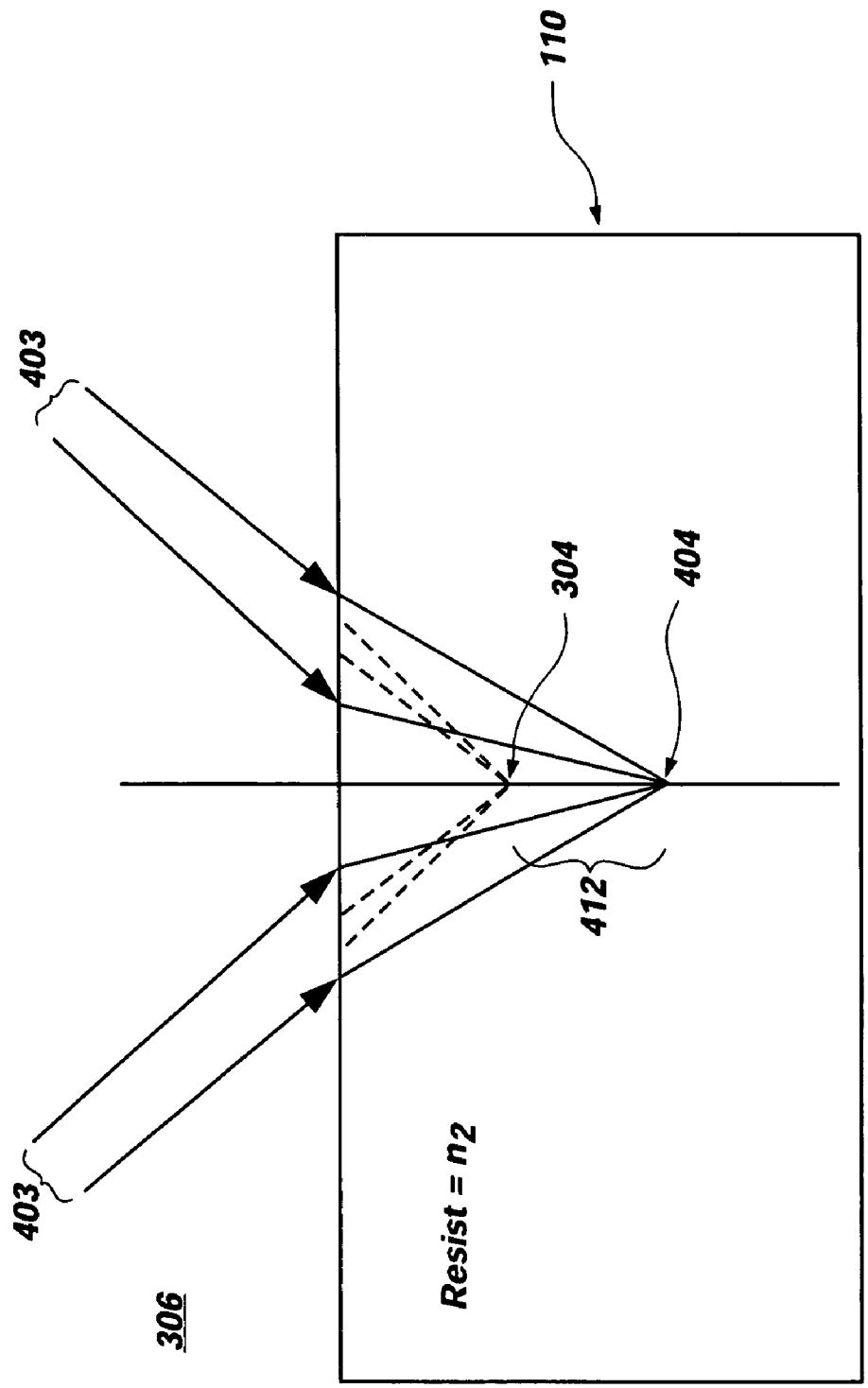
FIG. 6 is a schematic illustration of light incident on a cross-section of photoresist wherein photoresist-induced spherical aberration is eliminated.

FIG. 6 illustrates the interaction of light rays 403 of projected pattern image 407 (FIG. 5A) with photoresist 110 after adjustment in accordance with the present invention. Light rays 403, having a predetermined spherical aberration 412, irradiate photoresist 110. In an exemplary embodiment, the nominal focal point 404 of light rays 403 may be set approximately at the middle of photoresist 110 to provide more uniform exposure over the entire cross-section of photoresist 110. In other words, the highest intensity of light rays 403 may be focused at the middle of the cross-section of photoresist 110. Spherical aberration 412 may be approximately equal to the value of the photoresist spherical aberration when photoresist 110 is irradiated with light having a spherical aberration of zero as previously described with reference to FIG. 4A. Spherical aberration 412 may also be calculated based on the material properties of photoresist 110. In an exemplary embodiment, spherical aberration 412 may be calculated using the following formula:

$$a = (n^2 - 1) \cdot t / 8 \cdot n^2 \cdot s^4$$

where $a$ is the spherical aberration 412 of light rays 403, $n$ is the refractive index of photoresist 110, $t$ is the thickness of photoresist 110, and $s$ is the focal distance into photoresist 110. The refractive index of photoresist 110, $n$, may be typically within a range of about 1.4 to 2.0. For organic photoresists, $n$ is typically about 1.75. Photoresists 110 containing metal fillers may have a refractive index of up to about 2.0.

In another exemplary embodiment, spherical aberration 412 may be determined by taking process measurements. The best focus of different size and density features on mask 108 may be measured. Then differences in nominal focal points of the different size and density features of mask 108 provide a useful tool for estimating the necessary spherical aberration 412 to be introduced into mask pattern image 406 to best accommodate the range of exhibited focal points and provide a suitable operating window.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein that fall within the meaning and scope of the claims are encompassed by the present invention.

What is claimed is:

1. A method for determining a spherical aberration associated with a photoresist material, comprising:
    irradiating the photoresist material with a light having a spherical aberration of zero at a first focal distance in the photoresist material;
    measuring the spherical aberration of the light in the photoresist material at the first focal distance;

irradiating the photoresist material with the light having a spherical aberration of zero at least at one alternative focal distance;

measuring the spherical aberration of the light in the photoresist material at the at least at one alternative focal distance; and determining the spherical aberration associated with the photoresist material based at least partially on the measured spherical aberration of the light in the photoresist material at the first focal distance and the measured spherical aberration of the light in the photoresist material at the at least one alternative focal distance.

2. The method of claim 1, wherein irradiating the photoresist material with the light having a spherical aberration of zero at least at one alternative focal distance further comprises irradiating the photoresist material with the light having a spherical aberration of zero at a plurality of focal distances in the photoresist material.

3. The method of claim 2, wherein irradiating the photoresist material with the light having a spherical aberration of zero at a plurality of focal distances in the photoresist material comprises irradiating a mask pattern with the light having a spherical aberration of zero at a plurality of positions, wherein each position of the plurality has a different pattern feature size and density.

4. The method of claim 1, wherein irradiating the photoresist material with the light having a spherical aberration of zero at a first focal distance in the photoresist material comprises irradiating a mask pattern with the light having a spherical aberration of zero at a position having a first pattern feature size and density.

5. The method of claim 4, wherein irradiating the photoresist material with the light having a spherical aberration of zero at least at one alternative focal distance comprises irradiating the mask pattern with the light having a spherical aberration of zero at least at one alternative position having a second pattern feature size and density different from the first pattern feature size and density.

6. The method of claim 1, wherein determining the spherical aberration associated with the photoresist material comprises estimating a spherical aberration associated with the photoresist material based at least partially on the measured spherical aberration of the light in the photoresist material at the first focal distance and the measured spherical aberration of the light in the photoresist material at the at least one alternative focal distance.

7. The method of claim 1, further comprising irradiating the photoresist material with a mask pattern image having a spherical aberration substantially equal to the determined spherical aberration associated with the photoresist material.

* * * * *

UNITED STATES PATENT AND TRADEMARK OFFICE
CERTIFICATE OF CORRECTION

PATENT NO.       : 7,655,384 B2                                    Page 1 of 1
APPLICATION NO.  : 11/516423
DATED            : February 2, 2010
INVENTOR(S)      : Pary Baluswamy It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 235 days.

Signed and Sealed this

Twenty-third Day of November, 2010

David J. Kappos
*Director of the United States Patent and Trademark Office*